United States Patent
Leijten-Nowak

(10) Patent No.: US 7,271,617 B2
(45) Date of Patent: Sep. 18, 2007

(54) ELECTRONIC CIRCUIT WITH ARRAY OF PROGRAMMABLE LOGIC CELLS

(75) Inventor: Katarzyna Leijten-Nowak, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/545,643

(22) PCT Filed: Feb. 12, 2004

(86) PCT No.: PCT/IB2004/050108

§ 371 (c)(1),
(2), (4) Date: Aug. 16, 2005

(87) PCT Pub. No.: WO2004/075403

PCT Pub. Date: Sep. 2, 2004

(65) Prior Publication Data

US 2006/0158218 A1   Jul. 20, 2006

(30) Foreign Application Priority Data

Feb. 19, 2003   (EP) .................................. 03100383

(51) Int. Cl.
  *G06F 7/38*   (2006.01)
  *H03K 19/173*   (2006.01)
  *H03K 19/177*   (2006.01)
  *H01L 25/00*   (2006.01)

(52) U.S. Cl. ............................ 326/38; 326/37; 326/39; 326/40; 326/41; 326/47; 708/200; 708/235

(58) Field of Classification Search ............ 326/37–41, 326/47
See application file for complete search history.

(56) References Cited

U.S. PATENT DOCUMENTS

| | | | | |
|---|---|---|---|---|
| 5,546,018 | A * | 8/1996 | New et al. ..................... | 326/38 |
| 5,889,411 | A * | 3/1999 | Chaudhary ................... | 326/39 |
| 5,920,202 | A * | 7/1999 | Young et al. ................. | 326/39 |
| 6,107,827 | A * | 8/2000 | Young et al. ................. | 326/41 |
| 6,124,731 | A * | 9/2000 | Young et al. ................. | 326/41 |
| 6,157,209 | A * | 12/2000 | McGettigan ................. | 326/39 |
| 6,278,290 | B1 * | 8/2001 | Young ......................... | 326/41 |
| 6,288,570 | B1 * | 9/2001 | New ........................... | 326/41 |
| 6,427,156 | B1 * | 7/2002 | Chapman et al. ............ | 708/235 |
| 6,466,052 | B1 * | 10/2002 | Kaviani ....................... | 326/41 |
| 6,617,876 | B1 * | 9/2003 | Bilski .......................... | 326/41 |
| 6,708,191 | B2 * | 3/2004 | Chapman et al. ............ | 708/235 |
| 6,937,064 | B1 * | 8/2005 | Lewis et al. ................. | 326/40 |
| 7,193,433 | B1 * | 3/2007 | Young ......................... | 326/38 |
| 7,196,541 | B2 * | 3/2007 | Nowak-Leijten ............. | 326/38 |

* cited by examiner

*Primary Examiner*—Rexford Barnie
*Assistant Examiner*—Dylan White

(57) ABSTRACT

An electronic circuit has a programmable logic cell with a plurality of programmable logic units that are capable of being configured to operate in a multi-bit operand mode and a multiplexing mode. The programmable logic units are coupled in parallel between an input circuit and an output circuit. In a multi-bit operand processing mode the input circuit is configured to supply logic input signals from different ones of the logic inputs to the programmable logic units. The programmable logic units are coupled to successive positions along a carry chain at least in the multi-bit operand mode, so as to process carry signals from the carry chain. An output circuit passes outputs from the programmable logic units in parallel in the multi-bit operand mode. The programmable logic units have look-up tables which share the same configuration bits. The programmable logic units can also have multiplexers for passing one of the received input signals when configured to operate in a multiplexing mode of operation.

16 Claims, 6 Drawing Sheets

ELECTRONIC CIRCUIT WITH ARRAY OF PROGRAMMABLE LOGIC CELLS

This application is a 371 National Stage Application of PCT/IB04/50108 filed on Feb. 12, 2004 with a Foreign Priority Application 03100383.3 filed with the European Patent Office (EPO) on Feb. 19, 2003.

The invention relates to an electronic circuit with an array of programmable logic cells.

Programmable logic cells enable circuit designers to adapt the logic function of individual instances of electronic circuits that have been mass-produced, such as integrated circuits. This reduces the time interval from design to production of a working circuit and it reduces manufacturing cost for production of small batches of products and for prototyping.

In one example of an implementation, a programmable cell contains a memory that is addressed by the input signal of the cell, the memory storing pre-programmed output signals for each combination of input signal values at the respective addresses that are addressed by these values. The memory is said to have a LUT (Look-Up Table) function, for looking up the output signals that are produced in response to various input signals.

Any logic function can be implemented with a LUT, provided that it contains sufficient memory space. In practice, however, only logic functions that require a limited number of inputs, typically no more than four, are implemented with LUTs in circuits with programmable logic cells. Such a LUT requires 16 memory locations. This permits the programming of random logic functions of four input bits. In many cases circuits with such cells with four input bit functions suffice. A circuit with an array of such cells, in which the outputs of cells are coupled to the inputs of other cells, permits the designer to implement more complicated logic functions.

Increasingly designers are implementing logic functions for which a part of the array of programmable logic cells is used to implement signal-processing operations such as additions. Many signal processing operations have the property that many bits of a wider input operand each can influence many bits in an output result, through carry effects. However, very inefficient implementations are obtained when such a wide dependency is implemented using 4 bit input LUTs.

Xilinx™ has addressed this problem in its Virtex™ family of programmable logic devices by adding a carry chain to an array of 4 bit input LUT cells. FIG. 1 shows a programmable logic cell of such a device. The cell contains a four input lookup table 10 that performs the LUT function and a carry circuit 12 with a carry input and a carry output. The output of memory 10 is coupled to the carry circuit 12, which combines the carry input signal with the output signal of the LUT to form the carry output signal. An exclusive OR gate 14 is used to form the output signal of the cell from the carry input signal and output signal of the LUT. The carry input and carry output of the cell are coupled to the carry output and the carry input of adjacent cells in the array (not shown) to form a carry chain. The carry chain performs the carry function from the output of one 4 bit input LUT to another. As a result no LUTs need to be allocated to implement carry functions. This saves a considerable number of LUTs when the circuit is used to implement logic functions that include some signal processing operations.

Nevertheless, compared to dedicated signal processing circuitry, the implementation of signal processing functions in such a more general purpose circuit that is also capable of implementing random logic functions is still far less efficient. It would be desirable if this efficiency could be improved.

Among others, it is an object of the invention to provide an electronic circuit with an array of programmable logic cells that permit the implementation of signal processing operations, wherein the number of configuration bits is reduced.

The electronic circuit according to the invention is set forth in claim 1. The electronic circuit contains a programmable logic cell with a plurality of programmable logic units that are coupled in parallel. The programmable logic units comprise a configurable look-up table circuit, having inputs coupled to receive the logic input signals from the input circuit and having an output, the configurable look-up table providing an input output function in accordance with a predetermined number of configuration bits. The programmable logic units also comprise a controllable inverter/non-inverter circuit, having an input connected to the output of the look-up table circuit and having an output, the inverter/non-inverter being controllable by an input carry signal. The predetermined number of configuration bits control the look-up tables of two or more programmable logic units in the programmable logic cell. This has the advantage of reducing the number of configuration bits required by the logic cell, and hence the size of memory required.

In an embodiment, the programmable logic units further comprise an auxiliary multiplexer having inputs coupled to receive the output of the look-up table circuit and the output of the inverter/non-inverter circuit, and providing an output signal from the programmable logic units.

In a further embodiment, the programmable logic units further comprise a multiplexer having inputs coupled to receive the logic input signals from the input circuit, and providing a multiplexer output signal under control of a first control signal, when configured to operate in a multiplexer mode. The arrangement described in this embodiment has the advantage of providing multiplexing functions in addition to datapath functions.

These and other objects and advantageous aspects of the invention will be described using the following Figures.

Figure 2:
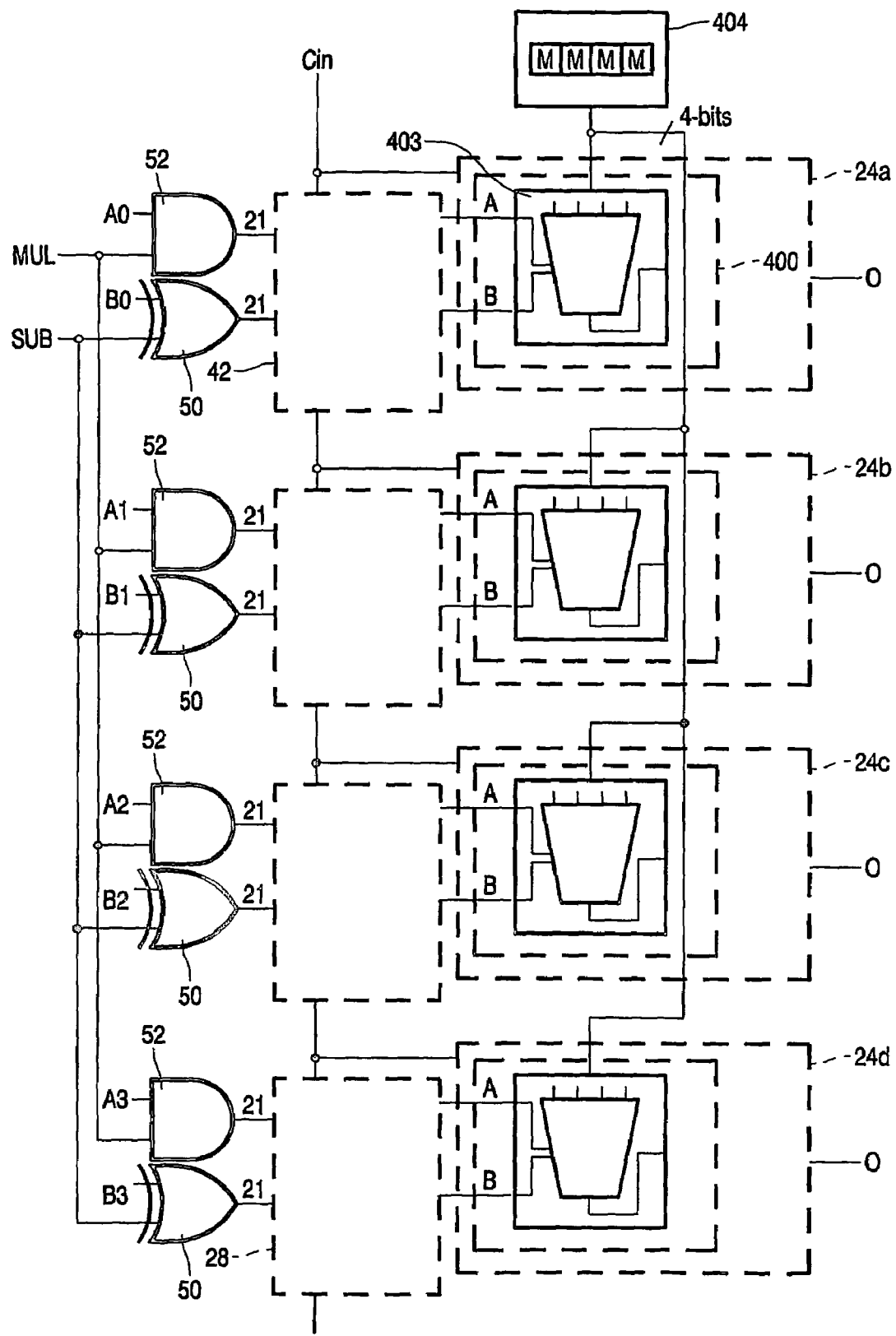
FIG. 2 shows an array of programmable logic units according to the present invention.

FIG. 2 shows a programmable logic cell having a parallel arrangement of programmable logic units 24a-d, and a carry chain 28. The logic cell receives input signals $A_{0-3}$ and $B_{0-3}$. Carry chain 28 has a carry input Cin and a carry output Cout, and is coupled to the programmable logic units at a series of positions along the chain.

Each programmable logic unit 24a-d comprises selection logic 403, for example a 4:1 multiplexer, which forms part of a look-up table 400 which is configured to provide an output signal O in response to a given set of input signals $A_n B_n$. The output of each programmable logic unit is determined by configuration bits stored in a configuration memory 404. According to the invention the configuration memory 404 is shared by a plurality of programmable logic units 24*a*-*d*, thereby permitting the logic cell to be optimized for the mapping of datapath functions. By programming the configuration bits, the function of the logic cell can be configured. The configuration bits determine which output signal values the programmable logic units 24*a*-*d* will produce in response to various input signal values.

In the multi-bit operand processing mode each programmable logic unit 24*a*-*d* is associated with a different significance level. The input circuit 22 is configured to pass signals to each programmable logic unit 24*a*-*d* that represent the bits from different operands, each bit corresponding to the significance level that is associated with the programmable logic unit 24*a*-*d*. Each programmable logic unit 24*a*-*d* responds to these signals by computing the bit of the result at the significance level that is associated with the programmable logic unit 24*a*-*d*, taking account of a carry input signal Cin that is received from carry chain 28 from a lower significance level and supplying a carry output signal Cout to the carry chain for use at a higher significance level. In the multi-bit operand mode, all programmable logic units 24*a*-*d* are configured to provide the same relation between their input signals and output signals, due to the sharing of the configuration bits in configuration memory 404. The computed bits "O" from each of the programmable logic units 24*a*-*d* are passed in parallel as output signals to an output circuit (not shown).

Carry chain 28 computes carry signals and passes these carry signals from one programmable logic unit 24*a*-*d* to another. The configuration of carry chain 28 controls whether carry chain 28 uses a carry input signal from carry input Cin to determine the carry signals. If the logic cell processes input signals that are more significant bits of a larger operand, the cell is configured so that such a carry input signal is used to receive a carry output signal of another cell that processes less significant operands.

Figure 1:
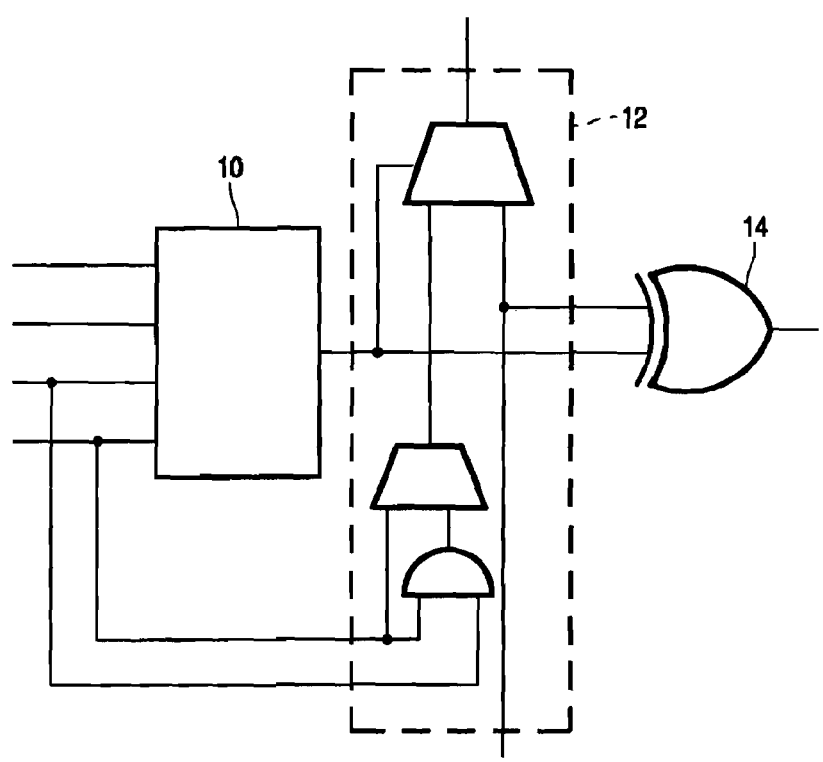
FIG. 1 shows a prior art programmable logic cell.

By using the programmable logic units for implementing computation of different significance levels of a two multi-bit operand signal processing operation, each based on the shared configuration bits, the number of configuration bits that is needed to support implementation of multi-bit operand signal processing is minimized. In the example of FIG. 2, with four two input programmable logic units 24*a*-*d*, only four configuration bits are required to define any four significance levels of any two-operand signal processing operation. In contrast, consider the situation where 4 configuration bits are employed per programmable logic unit, then 16 configuration bits would be needed for a logic cell having four 2-input programmable logic units, or 64 configuration bits for the logic unit according to the prior art shown in FIG. 1.

FIG. 2 also shows additional gates 50 and 52, which enable the programmable logic unit 24 to perform arithmetic subtraction without external complement formation and 1-bit multiplication-plus-accumulation (e.g. as a step in multi-bit multiplication). Implementation of subtraction is facilitated by adding an exclusive OR gate 50 between the LUT unit 400 and one of the signal inputs $A_n$, $B_n$ that receives a bit of the operand that must be subtracted. A subtraction control signal SUB is supplied to one of the inputs of exclusive OR gate 50 so that the input signal is logically inverted. The subtraction control signal is set to zero when addition is required. A common subtraction control signal for all of the programmable logic units in the logic cell may be used for this purpose. The subtraction signal may be controlled by a configuration bit of the logic cell or by a signal from outside the logic cell. In case of subtraction a logic high carry input signal is applied to the programmable logic unit that is associated with the lowest significance level.

Implementation of multiplication plus accumulation is supported by adding an AND gate 52 between the LUT unit 400 and one of the signal inputs A, B that receives a bit of the operand that must be multiplied and supplying a factor signal MUL to one of the inputs of this AND gate. A common factor signal MUL for all of the programmable logic units in the logic cell may be used for this purpose. The factor signal is set to one when addition is required.

Although FIG. 2 shows AND gate 52 and the exclusive OR gate 50 provided in combination, it will be readily apparent to a person skilled in the art that either may be omitted when no subtraction or multiplication is required. Also, it will be understood that multiplication and subtraction can be implemented in alternative ways, with equivalents of exclusive OR gate 50 at different positions in the circuit and/or a different configuration of LUT unit 400

Figure 3:
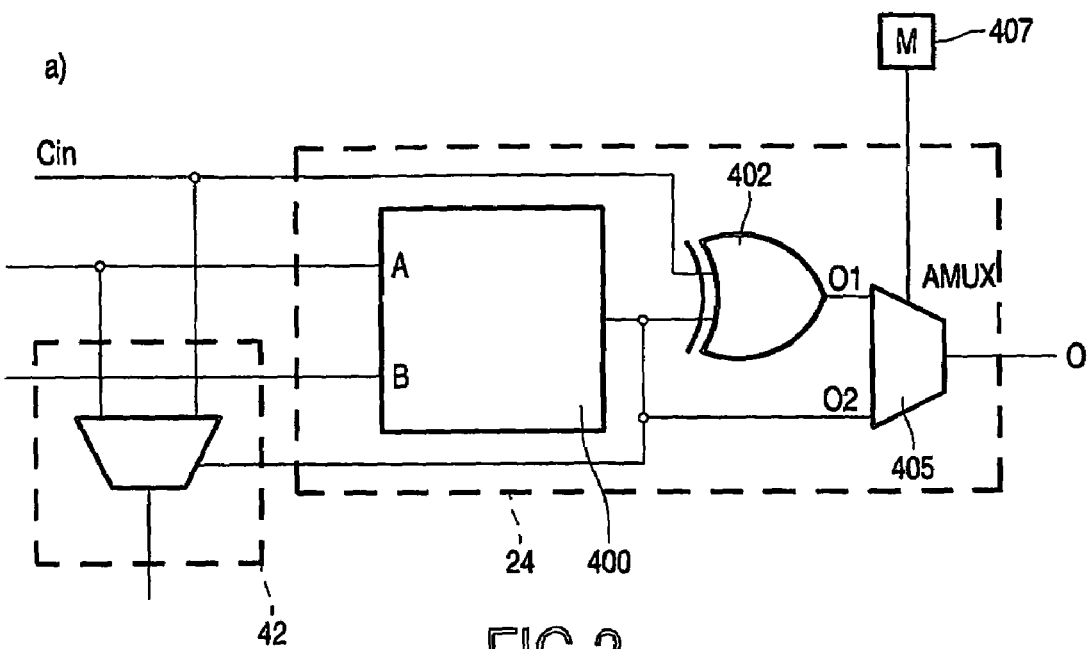
FIG. 3 shows further details of a programmable logic unit of FIG. 2, adapted to provide multiplexer functions.

FIG. 3 shows further detail of the programmable logic unit 24 and a part 42 of the carry chain 28. The programmable logic unit 24 comprises a LUT unit 400, which functions as previously described in FIG. 2. The programmable logic unit 24 also comprises an exclusive OR gate 402. The signal inputs A, B of programmable logic unit 24 are coupled to the inputs of LUT unit 400. An output of LUT unit 400 is coupled to an input of exclusive-OR gate 402. A second input of first exclusive OR-gate 402 is coupled to receive a carry input signal Cin from the carry chain 28, and an output of the exclusive OR gate 402 forms an output signal O1. A multiplexer 405 receives the output O1 from the XOR gate 402 and the output O2 from the LUT 400. The multiplexer 405 produces an output signal O under control of a configuration bit 407 from configuration memory (not shown).

In operation in the multi-bit operand processing mode, LUT unit 400 realizes a configurable input output function using the shared configuration bits, as previously described in FIG. 2. In this multi-bit operand processing mode a datapath output signal O1 is made available at the output O of the programmable logic unit 24. Alternatively, if wide boolean functions are being implemented, the multiplexer 405 selects the direct output O2 of the LUT 400.

It is noted that the XOR gate 402 may be implemented in other ways. For example, the XOR gate 402 may be replaced by a 2:1 multiplexer which receives the output of the look-up table at a first input and an inverted version of the output of the look-up table at a second input, with the multiplexer being controlled by the carry input signal Cin.

Figure 4:
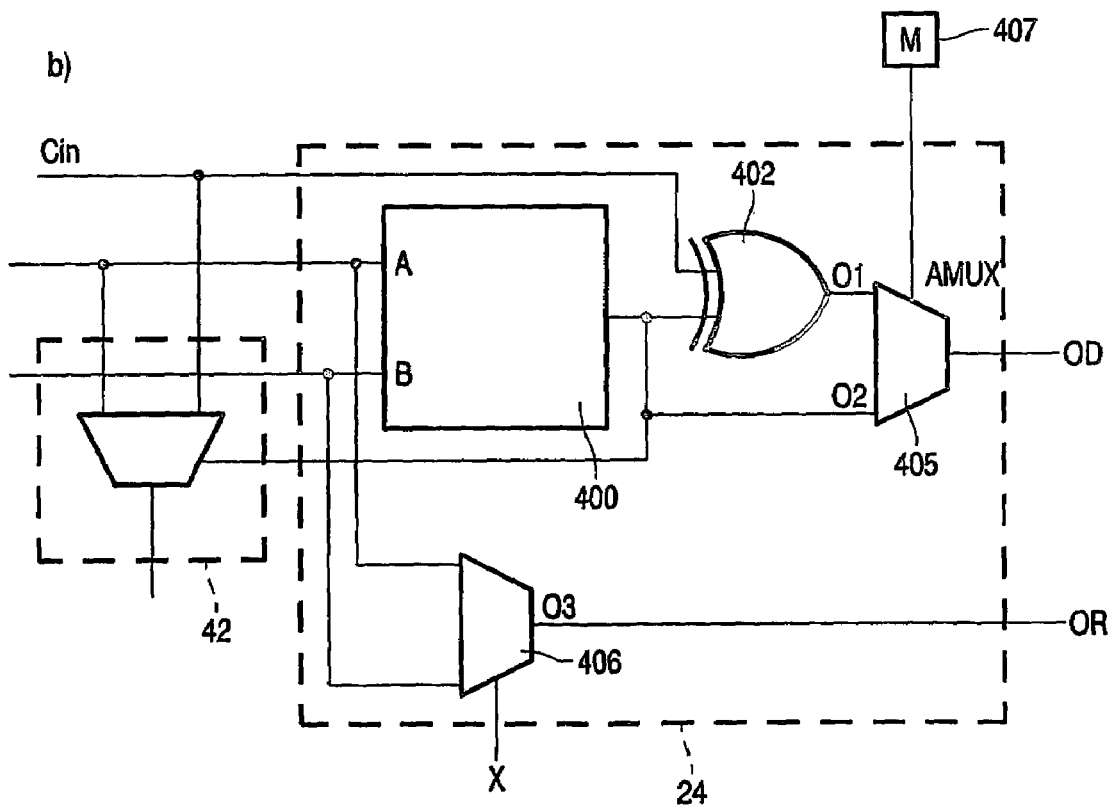
FIG. 4 shows an alternative embodiment of the programmable logic unit of FIG. 2, adapted to provide multiplexer functions.

FIG. 4 shows an alternative embodiment, which is capable of handling multiplexer functions in addition to multi-bit operand processing functions. The programmable logic unit comprises a LUT 400, an XOR gate 402 and a multiplexer 405 controlled by a configuration bit 407, having the same functions as the corresponding features of the invention as shown in FIG. 3. Additionally, the programmable logic unit comprises a further multiplexer 406 for use in a multiplexing mode of operation. The signal inputs A, B of the programmable logic unit 24 are coupled to the inputs of the multiplexer 406, (for example a 2:1 multiplexer for a 2-bit LUT), which is placed in parallel to the LUT unit 400. The multiplexer 406 is controlled by a control signal X, which is an auxiliary signal of the logic cell. Preferably, each programmable logic unit 24 receives the same control signal X. Thus, the programmable logic unit 24 produces a first output signal OD when configured to operate in a multi-bit operand processing mode (i.e. the multiplexer 405 outputting either the signal O1 from the LUT unit 400 or the signal O2 when configured to process wide Boolean functions), and a second output signal OR when configured to function as a multiplexer. Thus, when configured to operate as a multiplexer, the output signal OR bypasses the LUT unit 400 and the XOR gate 402. The provision of the multiplexer 406 in the programmable logic unit 24 enables the logic cell to be configured for multiplexing operations in addition to datapath or arithmetic functions.

Figure 5:
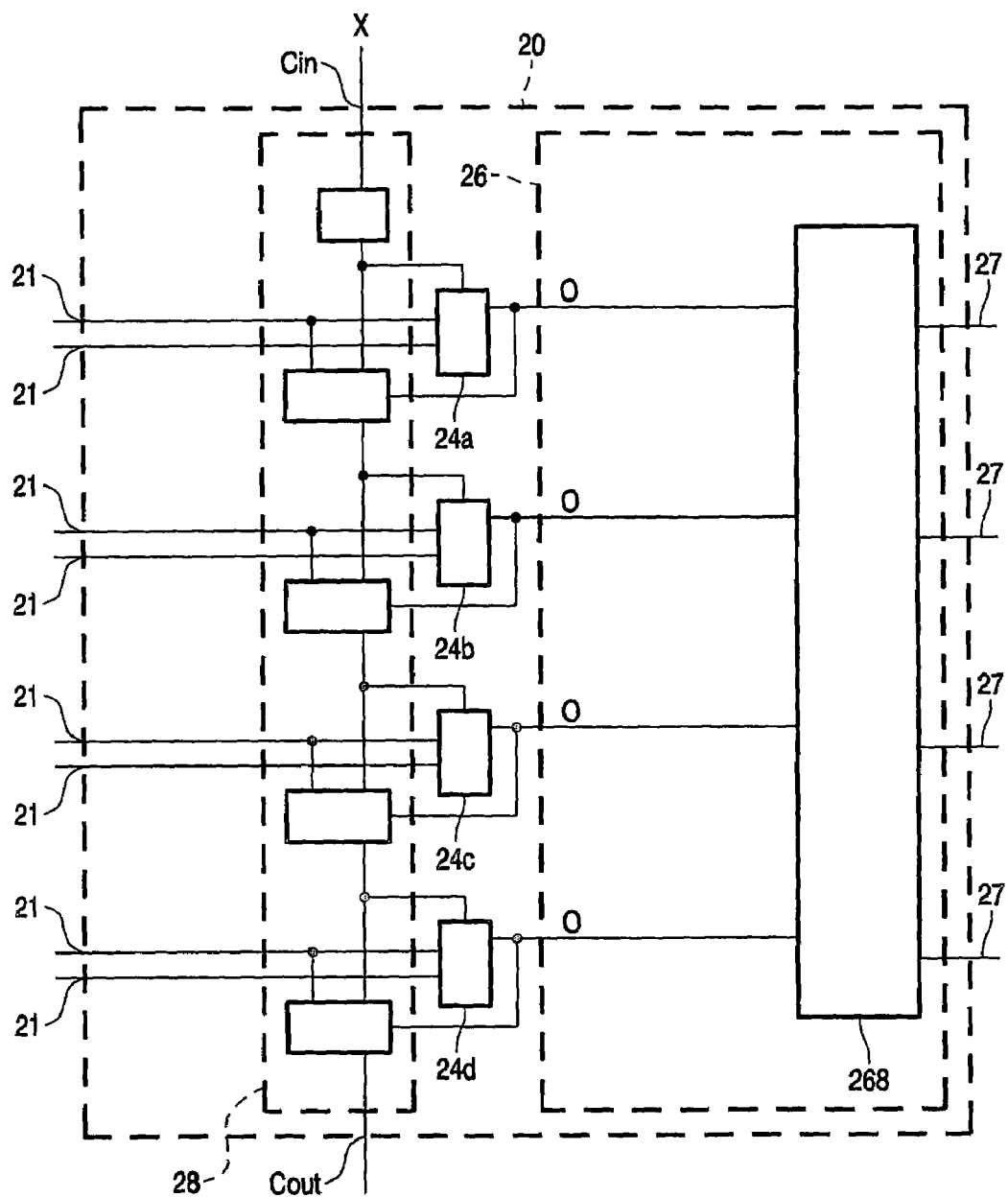
FIG. 5 shows a logic cell implementing an array of programmable logic units according to FIG. 3.

FIG. 5 shows an implementation of a logic cell 20 having programmable logic units 24a-d as shown in FIG. 3. Each programmable logic unit 24a-d receives input signals 21, and produces an output signal O according to the configuration bits (not shown) which are shared between all of the programmable logic units 24a-d. The output signals O are passed to a switching circuit 268 of the output circuit 26, which produces output signals 27.

Figure 6:
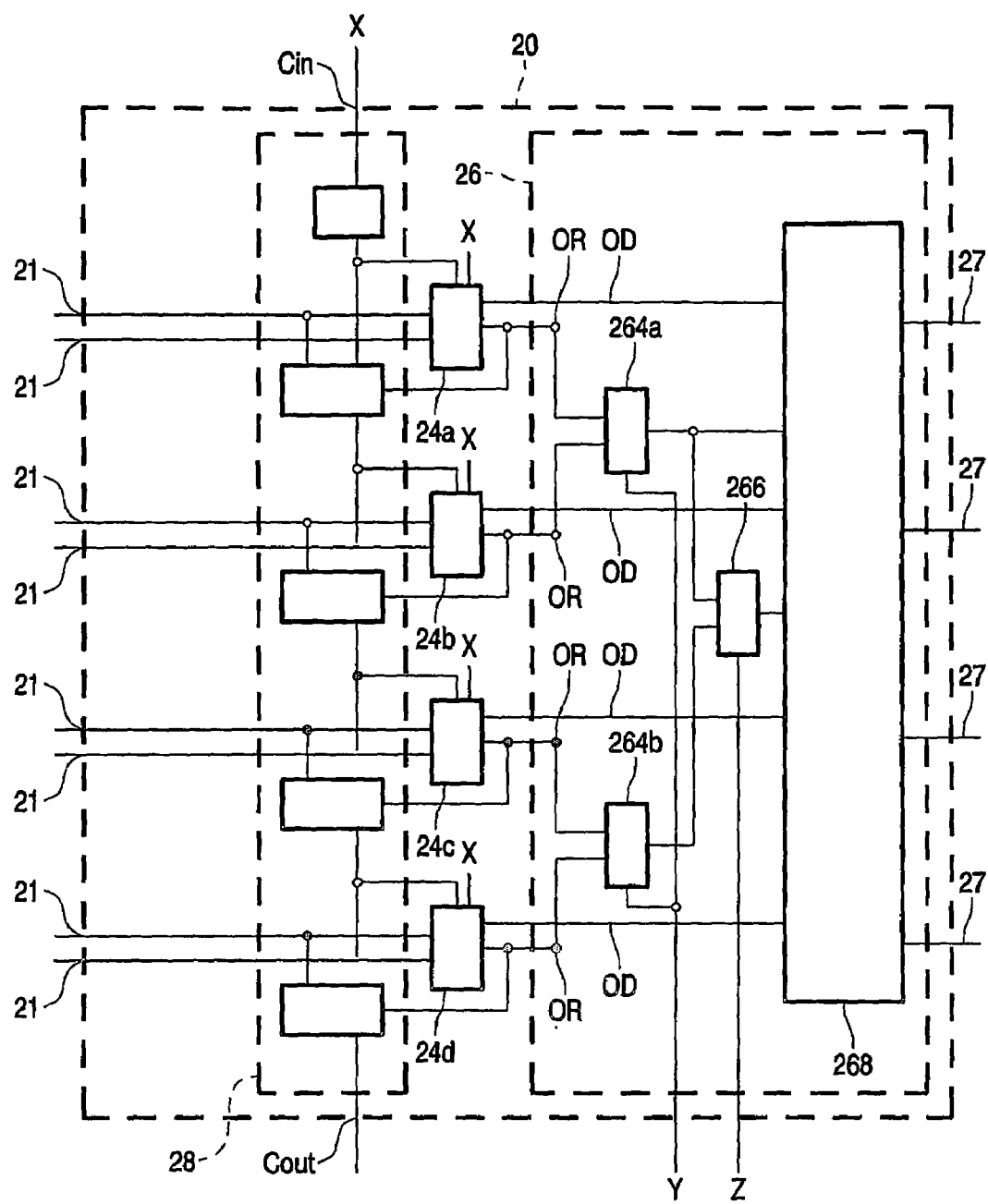
FIG. 6 shows a logic cell implementing an array of programmable logic units according to FIG. 4.

FIG. 6 shows an implementation of a logic cell 20 having programmable logic units 24a-d as shown in FIG. 4. When configured in the multi-bit operand processing mode, each programmable logic unit 24a-d receives input signals 21, and produces an output signal OD according to configuration bits (not shown) which are shared between all of the programmable logic units 24a-d. The output signals OD are passed to a switching circuit 268 of the output circuit 26, which produces output signals 27. When configured to operate in a multiplexer mode, the plurality of programmable logic units 24a-d produce and output signal OR. The output signal OR is one of the input signals 21, selected by the control signal X. In the multiplexer mode, the output signals OR are passed to the inputs of a first stage of multiplexers 264a,b in the output circuit 26. The first stage of multiplexers are controlled by a control signal Y. The further multiplexer 266 is connected to receive the output signals from the multiplexers 264a, 264b, and provides a multiplexer output signal to the switching circuit 268 under control of control signal Z.

In practice, two types of multiplexers can be encountered in applications: random-logic multiplexers which accept a plurality of single-bit inputs and produce a single bit output (for example a 8:1 multiplexer, and datapath multiplexers which accept a multi-bit input and produce a multi-bit output (for example a 4-bit 2:1 multiplexer).

The logic cell is configurable to provide both types of multiplexers using up to three auxiliary signals, X, Y and Z, in addition to the eight primary input signals. The three auxiliary signals X, Y and Z are used as selection signals for the logic multiplexers mapped onto the logic cell. The three signals are required in order to deal with the maximum case of a 1-bit 8:1 multiplexer. With other multiplexer arrangements fewer auxiliary signals are required.

It is noted that the control signal X can be shared between the datapath and multiplexer modes. In the datapath mode control signal X provides the carry input signal Cin to the carry chain 28, while in the multiplexer mode the control signal X is used to control the multiplexers 406 of FIG. 4. In a similar manner the control signals Y and Z of the multiplexer mode can be shared with the control signals MUL and SUB of the multi-bit operand processing mode. It is also noted that the control signals may be derived from dedicated auxiliary control signals, or taken from the plurality of primary input signals.

The logic cells shown in FIGS. 5 and 6 include four processing elements, thereby allowing an implementation of 4-bit datapath functions. Nevertheless, it is noted that the number of processing elements (bit-slices) in the logic cell may be arbitrary. For example, each cell may be made such that it processes a complete word of 32 bits, for example.

Figure 7:
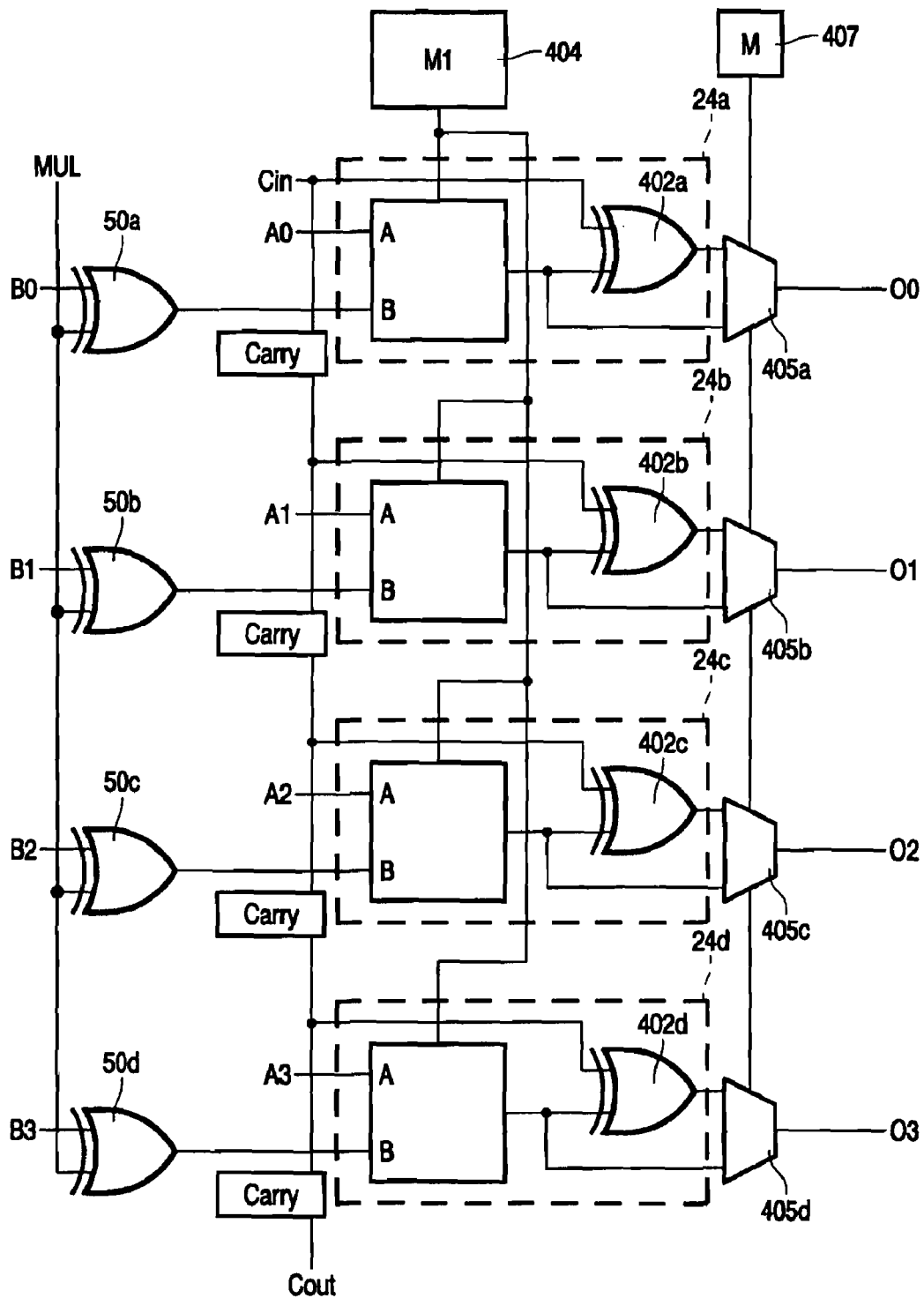
FIG. 7 shows a logic cell of the present invention when configured with a programmable logic unit as shown in FIG. 3.

FIG. 7 shows an example implementation of a logic cell configured with the programmable logic units of FIG. 3, and having XOR gates 50a-d at their inputs to allow subtraction. The programmable logic units 24a-d are controlled by configuration bits 404 which are shared between the programmable logic units 24a-d. The multiplexers 405a-d are controlled by a further configuration bit 407. The subtraction signal SUB is connected to either a configuration bit or to an external dynamic signal. Thus, it can be seen that, in the worst case, only six configuration bits are required to control the logic cell 20, which is less than the number of configuration bits required to control a typical arithmetic logic unit. The functionality of FIG. 7 can be improved further if the programmable logic units of FIG. 4 are incorporated to give additional multiplexer mapping capabilities, or if the AND gates 52a-d of FIG. 2 are used to provide multiplier mapping capabilities.

The invention described above provides a logic cell which is optimized for mapping datapath functions, thereby reducing the size of the configuration memory, making it suitable for use in a reconfigurable Systems-on-a-Chip (SoC) application. The logic cell can therefore be used as a basic logic block of a datapath optimized embedded FPGA, or used as a reconfigurable functional unit within a processor core. It can also be applied to the implementation of traditional stand-alone FPGAs. Furthermore, it can also be used for the implementation of parametrisable ALUs, and has the advantage of requiring less configuration memory and being configurable to provide more flexibility, i.e. the additional possibility of mapping multiplexers and subtraction and/or multiplier functions.

The invention claimed is:

1. An electronic circuit with an array of programmable logic cells, each of the cells comprising:
    a plurality of programmable logic units coupled in parallel, and connected to receive input signals from an input circuit, the plurality of programmable logic units being configurable to operate in a multi-bit operand processing mode,
    wherein:
    each programmable logic unit includes:
        a configurable look-up table circuit that includes inputs coupled to receive the logic input signals from the input circuit and an output, the configurable look-up table providing an input output function in accordance with a predetermined number of configuration bits; and
        a controllable inverter/non-inverter circuit that includes an input connected to the output of the look-up table circuit and an output, the inverter/non-inverter being controllable by an input carry signal; and
    the predetermined number of configuration bits control the look-up tables of two or more programmable logic units in the programmable logic cells.

2. The electronic of claim 1, wherein the programmable logic units include an auxiliary multiplexer having inputs coupled to receive the output of the look-up table circuit and the output of the inverter/non-inverter circuit, and providing an output signal from the programmable logic units.

3. The electronic circuit of claim 2, wherein the auxiliary multiplexer is controlled by configuration information from a configuration memory.

4. The electronic circuit of claim 1, wherein the programmable logic units include a multiplexer having inputs coupled to receive the logic input signals from the input circuit, and providing a multiplexer output signal under control of a first control signal X, when configured to operate in a multiplexer mode.

5. The electronic circuit of claim 4, including an output circuit that includes a first stage of multiplexers for receiving the multiplexer output signals from a plurality of programmable logic units, the first stage of multiplexers being controlled by a second control signal Y.

6. The electronic circuit of claim 5, wherein the output circuit includes a further stage of multiplexing that includes a further multiplexer configurable to receive the outputs of the multiplexers in the first stage of multiplexers, and provides an output signal under control of a third control signal Z.

7. The electronic circuit of claim 6, wherein at least one of the first, second or third control signals X, Y, Z of the multiplexer mode is shared with a control signal used in the multi-bit operand processing mode.

8. The electronic circuit of claim 1, including a carry input and a carry output, a carry chain coupled between the carry input, the input circuit, and the carry output;
the programmable logic units being coupled to successive positions along the carry chain at least in the multi-bit operand mode, so as to process carry signals from the carry chain, and passing outputs from the programmable logic units in parallel in the multi-bit operand mode.

9. The electronic circuit of claim 1, wherein the cell includes a subtraction control circuit arranged to control at least a carry output determination operation of the carry chain, the carry chain determining a carry output signal from input signals and carry input signals at each position along the carry chain, control by the subtraction control circuit switching the carry output determination at least between a determination appropriate for addition and determination appropriate for subtraction, under control of a subtraction control signal.

10. The electronic circuit of claim 1, wherein the cell includes a respective multiplication circuit for each programmable logic unit, coupled to multiply at least one of the inputs signals of the programmable logic unit with a multiplicand prior to supplying said at least one of the input signals to an input of the programmable logic unit.

11. The electronic circuit of claim 1, wherein each of the programmable logic units includes two unit inputs for signals from the logic inputs, each programmable logic unit being configurable to implement independently any two-input bit logic function of the logic inputs.

12. The electronic circuit of claim 1, wherein the carry chain circuit includes a configurable coupling between said positions and a the carry input of the cell, for configurably supplying either a carry input signal to the carry chain or a standard signal, under control of configuration information from a configuration memory.

13. The electronic circuit of claim 1, wherein the carry chain circuit includes a plurality of configurable couplings, each coupled between a respective one of said positions and a respective one of the programmable logic units, for configurably supplying either a carry signal from said position to the programmable logic circuit or a further signal that is not a result of propagation through the carry chain, under control of configuration information from a configuration memory.

14. The electronic circuit of claim 1, wherein the inverter/non-inverter circuit includes an exclusive OR circuit.

15. The electronic circuit of claim 1, wherein the inverter/non-inverter circuit includes a multiplexer, said multiplexer receiving the output of the look-up table at a first input and an inverted version of the output of the look-up table at a second input, the multiplexer being controlled by the carry signal.

16. The electronic circuit of claim 1, configured to perform a multi-bit operand signal processing function, wherein each of the programmable logic units is configured to provide the same input-output relation subject to a carry input signal from the carry chain, and the output circuits outputs output signals from the programmable logic units in parallel.

* * * * *